United States Patent [19]
Suda et al.

[11] Patent Number: 5,772,770
[45] Date of Patent: Jun. 30, 1998

[54] SUBSTRATE PROCESSING APPARATUS

[75] Inventors: Atsuhiko Suda; Satohiro Okayama, both of Tokyo, Japan

[73] Assignee: Kokusai Electric Co, Ltd., Tokyo, Japan

[21] Appl. No.: 591,773

[22] Filed: Jan. 25, 1996

[30] Foreign Application Priority Data

Jan. 27, 1995 [JP] Japan ................................... 7-031508

[51] Int. Cl.$^6$ .................................................. C23C 16/00
[52] U.S. Cl. ................. 118/719; 118/723 R; 118/723 E; 118/725; 156/345
[58] Field of Search ............................. 118/719, 723 R, 118/723 E, 725; 156/345

[56] References Cited

U.S. PATENT DOCUMENTS

| 4,987,856 | 1/1991 | Hey ........................................ 118/719 |
| 5,232,508 | 8/1993 | Arena ...................................... 118/719 |
| 5,336,326 | 8/1994 | Karner ............................. 118/723 HC |

FOREIGN PATENT DOCUMENTS

| 61-2319 | 1/1986 | Japan .................................... 118/715 |
| 63-141318 | 6/1988 | Japan ................................. 118/723 E |
| 2-46723 | 2/1990 | Japan .............................. 118/723 ER |
| 4-10335 U | 1/1992 | Japan . |
| A-5-160031 | 6/1993 | Japan . |
| A-5-160032 | 6/1993 | Japan . |
| A-5-160033 | 6/1993 | Japan . |
| A-5-160035 | 6/1993 | Japan . |
| A-5-160036 | 6/1993 | Japan . |

*Primary Examiner*—Richard Bueker

[57] ABSTRACT

A plasma CVD apparatus comprises an outer chamber having an exhaust hole, an inner chamber disposed in the outer chamber, a reactive gas inlet pipe communicating with the inner chamber, a first exhaust pipe disposed so as to communicate with the inner chamber, the first exhaust pipe extending at least to an inner wall surface of the outer chamber, and a second exhaust pipe communicating with the exhaust hole. Preferably the forward end of the first exhaust pipe is inserted into the exhaust hole, the forward end of the first exhaust pipe projects outward beyond the inner wall surface of the outer chamber, and a spacing is formed between the first exhaust pipe and the exhaust hole. The reactive gases flow into the inner chamber through the reactive gas inlet pipe and directly flow out of the outer chamber through the first exhaust pipe, thereby preventing the reactive gases from flowing into the outer chamber.

28 Claims, 8 Drawing Sheets

SUBSTRATE PROCESSING APPARATUS

BACKGROUND OF THE INVENTION

1. Field of the Invention

The present invention relates to a substrate processing apparatus, and particularly to a two-chamber plasma CVD (Chemical Vapor Deposition) apparatus having an outer chamber and an inner chamber.

2. Description of the Related Art

Semiconductor manufacturing processes include a plasma CVD process of depositing a film onto a substrate. In the plasma CVD process, a pair of parallel plate electrodes are disposed opposite to each other in an airtight processing chamber. A substrate is placed on either one of the electrodes. While supplying reactive gases into the processing chamber, radio frequency power is applied between the pair of electrodes so as to generate plasma, whereby gas molecules are excited by the plasma to deposit a thin film onto the substrate surface.

In recent years, a gas cleaning method of cleaning a processing chamber using plasma has been of particular interest. According to this method, while feeding a cleaning gas such as $NF_3$ into the processing chamber, radio frequency power is applied between electrodes so as to generate plasma, whereby cleaning gas molecules are excited by the plasma to remove in an etching manner reaction byproducts which have adhered to or deposited onto the electrode surfaces and the surface of the processing chamber while depositing film.

A conventional cleaning method involves additional processes after a film has been deposited, namely lowering the temperature of the processing chamber after a film has been deposited, opening the processing chamber to the air, disassembling the chamber, cleaning the chamber, reassembling the chamber, evacuating the assembled chamber, and then raising the temperature of the chamber. In contrast, in the above-described gas cleaning method, these additional processes can be eliminated, thereby significantly improving the availability of the apparatus.

In order to achieve efficient deposition of films and gas cleaning, there is proposed a two chamber type plasma CVD apparatus having an inner chamber and an outer chamber. By employing the inner chamber, the generation of plasma can be confined to the inside of the inner chamber. Accordingly, the deposition of films can also be confined to the inside of the inner chamber, and the density of plasma can be increased with a resultant improved efficiency in depositing films. Further, when the gas cleaning is effected, the cleaning efficiency can also be improved.

FIG. 1 is a schematic cross-section of a two chamber plasma CVD apparatus. A plasma CVD apparatus 300 is provided with a processing chamber 1 having an outer chamber 15 and an inner chamber 12.

An inner chamber wall 2 is disposed on the top plate 101 of the processing chamber 1, and a cathode 4 is disposed inside the inner chamber wall 2 via an insulator 3. The cathode 4 has a hollow portion 7 therein. A reactive gas inlet pipe 5 is provided at the top portion of the cathode 4 such that the gas inlet pipe 5 communicates with the hollow portion 7. A shower plate 106 is disposed at the lower portion of the cathode 4. The shower plate 106 has a large number of gas dispersion holes 6 for dispersing a reactive gas led into the hollow portion 7 through the reactive gas inlet pipe 5.

An anode 9 is disposed at the lower position of the processing chamber 1, such that the anode 9 is vertically movable and is opposite to the cathode 4. A susceptor 10 is disposed on the anode 9, and a substrate 11 is placed on the susceptor 10. As the anode 9 rises, the susceptor 10 rises together to close an opening at the bottom of the inner chamber wall 2, whereby separating an outer chamber space 151 from an inner chamber space 121. The susceptor 10 has a predetermined number of inner chamber exhaust holes 13 arranged along the circumference thereof for allowing communication between the inner chamber space 121 and the outer chamber space 151. Also, an outer chamber exhaust hole 14 is provided at a corner of the bottom plate 102 of the processing chamber 1. FIG. 1 does not show a substrate loading/unloading openings provided in the processing chamber 1. The reactive gas inlet pipe 5 is connected to an RF power supply 8, and the anode 9 is grounded.

When a film is deposited using the plasma CVD apparatus 300, first, the substrate 11 is placed on the susceptor 10 in the state in which the anode 9 is situated at its lowered position. Then, the anode 9 is raised to close the opening at the bottom of the inner chamber wall 2, thereby defining the inner chamber space 121. While controlling the pressure of the inner chamber 12 to a predetermined value by evacuating the inner chamber 12 through the inner chamber exhaust holes 13, the outer chamber space 151 and the outer chamber exhaust hole 14 and by introducing reactive gases into the inner chamber 12 through the reactive gas inlet pipe 5 to disperse the reactive gases through the gas dispersion holes 6, radio frequency power from the radio frequency generator 8 is applied between the cathode 4 and the anode 9. As a result, plasma is generated to deposit a film on the substrate 11. The generated plasma is confined to the narrow space of the inner chamber space 121, and hence becomes dense. Thus, the film can be deposited by high density plasma at high efficiency. The reacted gases flow out into the outer chamber space 151 through the inner chamber exhaust holes 13 and then flows out of the processing chamber 1 through the outer chamber exhaust hole 14.

When gas cleaning is performed using the plasma CVD apparatus 300, first, the anode 9 is raised without placing the substrate 11 on the susceptor 10 to close the opening at the bottom of the inner chamber wall 2, thereby defining the inner chamber space 121. Subsequently, while controlling the pressure of the inner chamber 12 to a predetermined level by evacuating the inner chamber 12 through the inner chamber exhaust holes 13, the outer chamber space 151, and the outer chamber exhaust hole 14 and by introducing a cleaning gas such as $NF_3$ into the inner chamber 12 through the reactive gas inlet pipe 5, radio frequency power from the radio frequency generator 8 is applied between the cathode 4 and the anode 9 to generate plasma, whereby reaction byproducts which have been adhered to or deposited onto the inner surface of the inner chamber 12 are etched away. In this case, the generated plasma is also confined to the narrow space of the inner chamber space 121, and hence becomes dense. Thus, the gas cleaning can be performed at high efficiency. The reacted gas flows out into the outer chamber space 151 through the inner chamber exhaust holes 13 and then flows out of the processing chamber 1 through the outer chamber exhaust hole 14.

In the plasma CVD apparatus 300, the gases which have been introduced into the inner chamber 12 through the reactive gas inlet pipe 5 flow out into the outer chamber space 151 through the inner chamber exhaust holes 13 and then flow out of the processing chamber 1 through the outer chamber exhaust hole 14 provided in the bottom plate 102 of the processing chamber 1. Therefore, the reactive gases and reaction byproducts flow out into the outer chamber space 151 through the inner chamber exhaust holes 13, causing the reaction byproducts to adhere to the inner wall of the outer chamber 15 to require a periodical cleaning of the outer chamber 15. As a result, the availability of the plasma CVD apparatus 300 drops accordingly.

SUMMARY OF THE INVENTION

It is, therefore, a main object of the present invention to provide a two-chamber substrate processing apparatus which has an inner chamber and an outer chamber and which can prevent reactive gases and reaction byproducts from entering the outer chamber.

According to the present invention, there is provided a substrate processing apparatus comprising:

an outer chamber having an exhaust hole;

an inner chamber disposed in the outer chamber;

a reactive gas inlet pipe communicating with the inner chamber;

a first exhaust pipe disposed to be capable of communicating with the inner chamber, the first exhaust pipe extending at least to an inner wall surface of the outer chamber; and a second exhaust pipe communicating with the exhaust hole.

Preferably, the forward end of the first exhaust pipe is inserted into the exhaust hole, the forward end of the first exhaust pipe projects outward beyond the inner wall surface of the outer chamber, and a spacing is formed between the first exhaust pipe and the exhaust hole.

In this case, since the inner chamber is exhausted through the second exhaust pipe which communicates with the exhaust hole in the outer chamber, the pressure of the inner chamber can be indirectly measured with a pressure detector, if any, communicating with the outer chamber.

Alternatively, the substrate processing apparatus of the present invention may further comprise a first exhaust line having the second exhaust pipe and a second exhaust line having the first exhaust pipe and being capable of being exhausted independently of the first exhaust line.

Preferably, the substrate processing apparatus of the present invention further comprises a substrate placing portion disposed in said inner chamber, wherein the inner chamber has a plurality of second exhaust holes surrounding the substrate placing portion, and the plurality of second exhaust holes is capable of communicating with the first exhaust pipe.

Still, preferably, the substrate processing apparatus of the present invention further comprises an exhaust chamber disposed in the outer chamber, the exhaust chamber being disposed under the inner chamber, wherein the inner chamber communicates with the exhaust chamber through the second exhaust holes, and the first exhaust pipe communicates with the exhaust chamber.

In this case, preferably, the first exhaust pipe communicates with the exhaust chamber substantially at the center of the substrate placing portion as viewed from above the substrate placing portion.

Also, the first exhaust pipe may communicate with the exhaust chamber, at a portion within a circle having a radius of L/4 and centered at the center of the substrate placing portion as viewed from above the substrate placing portion, where L is a distance between a pair of second exhaust holes which are most distant from each other among second exhaust holes.

Alternatively, the substrate processing apparatus of the present invention further comprises:

one or more third exhaust pipes disposed to be capable of communicating with the inner chamber, the one or more third exhaust pipes extending at least to the inner wall surface of the outer chamber;

a substrate placing portion disposed in the inner chamber, the inner chamber having a plurality of second exhaust holes surrounding the substrate placing portion; and an exhaust chamber disposed in the outer chamber, the exhaust chamber being disposed under the inner chamber, the inner chamber communicating with the exhaust chamber through the second exhaust holes, the first exhaust pipe and the one or more third exhaust pipes communicating with the exhaust chamber.

In this case, preferably, the substrate placing portion has a substantially rectangular shape as viewed from above, and the first exhaust pipe and one or more third exhaust pipes communicate with the exhaust chamber at positions located on one of or both of the two diagonals of the rectangle symmetrically with respect to the center of the rectangle.

Also, preferably, the substrate processing apparatus of the present invention is a plasma processing apparatus, the outer chamber has a lower outer chamber and an upper outer chamber, one of a cathode and an anode is mounted in the upper outer chamber, an inner chamber upper wall is mounted on the upper outer chamber such that the inner chamber upper wall surrounds the one of the cathode and the anode, the other of the cathode and the anode is disposed in the outer chamber in a vertically movable manner, the other of the cathode and the anode has a substrate placing portion, an inner chamber lower wall corresponding to the inner chamber upper wall is provided around the other of the cathode and the anode, a plurality of second exhaust holes are formed in the inner chamber lower wall such that the second exhaust holes surround the substrate placing portion, the second exhaust holes being capable of communicating with the first exhaust pipe, the other of the cathode and the anode rises to form the inner chamber by means of the cathode, the anode, the inner chamber upper wall, and the inner chamber lower wall, and when the other of the cathode and the anode rises to form the inner chamber, the first exhaust pipe extends at least to the inner wall surface of the outer chamber.

Preferably, when the other of the cathode and the anode rises to form the inner chamber, the forward end of the first exhaust pipe is inserted into the exhaust hole such that the forward end of the first exhaust pipe projects outward beyond the inner wall surface of the outer chamber, and a spacing is formed between the first exhaust pipe and the exhaust hole.

Preferably, the substrate processing apparatus of the present invention further comprises an exhaust chamber disposed in the outer chamber, the exhaust chamber being disposed under the other of the cathode and the anode, wherein the inner chamber communicates with the exhaust chamber through the second exhaust holes, and the first exhaust pipe communicates with the exhaust chamber.

Further, according to the present invention, there is provided a substrate processing apparatus comprising:

an outer chamber having a first exhaust hole;

an inner chamber disposed in the outer chamber;

a reactive gas inlet pipe communicating with the inner chamber; and a substrate placing portion disposed in the inner chamber, wherein the inner chamber has a plurality of second exhaust holes surrounding the substrate placing portion and communicates with the outer chamber through the second exhaust holes, and the first exhaust hole is located substantially at the center of the substrate placing portion as viewed from above the substrate placing portion.

And further, according to the present invention, there is provided a substrate processing apparatus comprising:

an outer chamber having a first exhaust hole;

an inner chamber disposed in the outer chamber;

a reactive gas inlet pipe communicating with the inner chamber;

a substrate placing portion disposed in the inner chamber, the inner chamber having a plurality of second exhaust holes surrounding the substrate placing portion; and an exhaust chamber disposed in the outer chamber, the exhaust chamber being disposed under the inner chamber, wherein the inner chamber communicates with the exhaust chamber through the second exhaust holes, and the exhaust chamber has a third exhaust hole, which is located substantially at the center of the substrate placing portion as viewed from above the substrate placing portion.

The substrate processing apparatus according to the present invention is preferably used as a plasma processing apparatus, further preferably as a plasma CVD apparatus.

The plasma CVD apparatus according to the present invention is particularly preferably used for manufacturing liquid crystal displays (LCD) and semiconductor devices.

BRIEF DESCRIPTION OF THE DRAWINGS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS (First embodiment)

Figure 2:
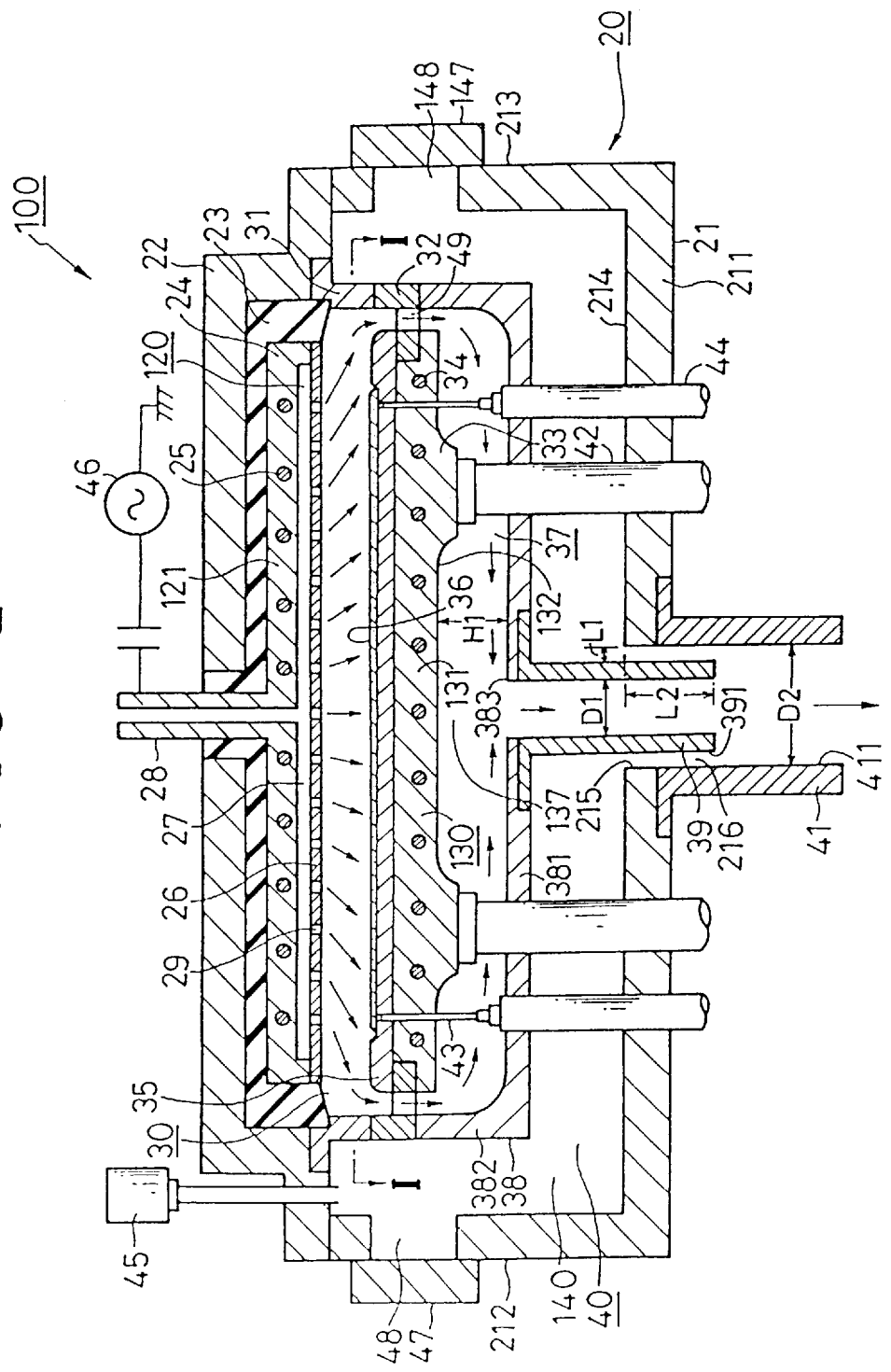
FIG. 2 is a cross-sectional view for explaining a plasma CVD apparatus according to a first embodiment of the present invention.
Figure 3:
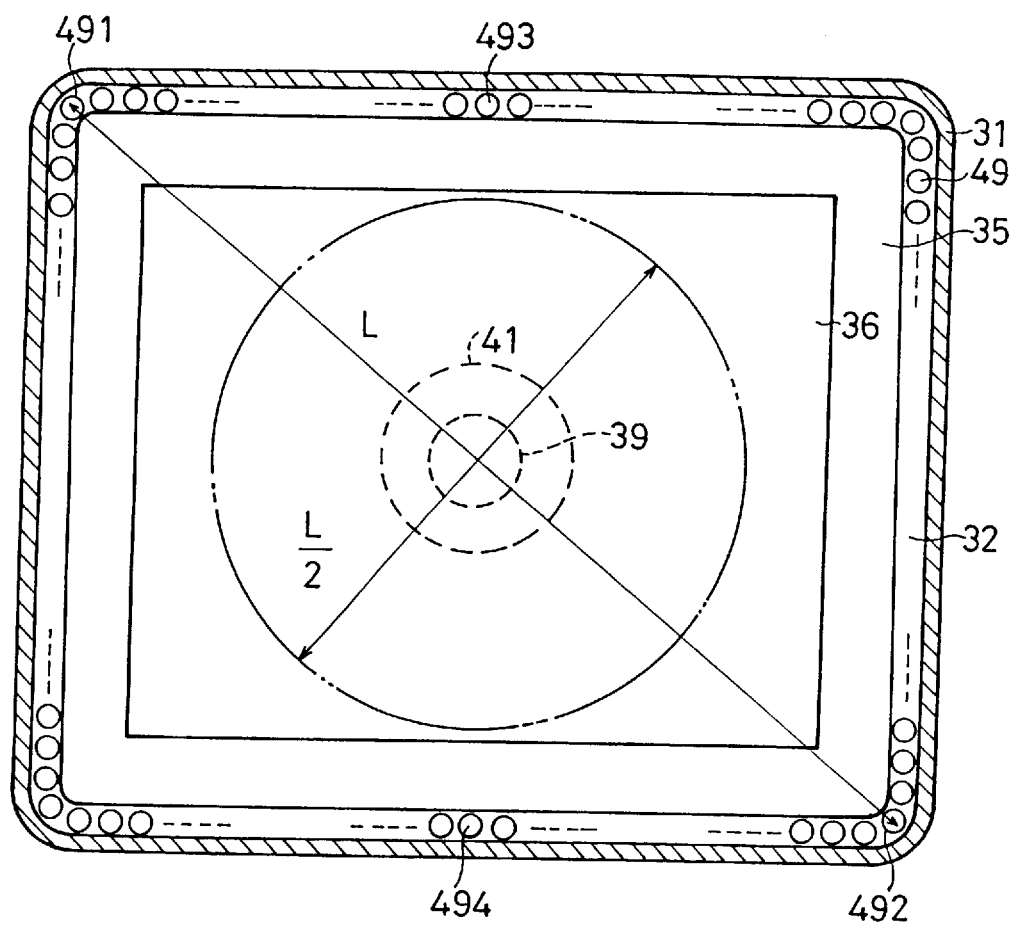
FIG. 3 is a cross-sectional view along the line I—I of FIG. 2.

Referring to FIGS. 2 and 3, a plasma CVD apparatus 100 according to a first embodiment of the present invention includes a processing chamber 20, which has a two chamber structure composed of an outer chamber 40 and an inner chamber 30.

The processing chamber 20 has a processing chamber body 21 and a top cover 22. The top cover 22 has an upward projecting cross-sectional shape with a flat top. A cathode 120 is disposed in the central indented portion of the top cover 22 via an insulator 23. The cathode 120 has a cathode heater 24, a shower plate 26, and a reactive gas inlet pipe 28. A rod-like heater wire 25 for resistance heating is embedded in an aluminum member 121 to form the cathode heater 24. A spacing 27 is formed between the cathode heater 24 and the shower plate 26. The reactive gas inlet pipe 28 communicates with the spacing 27. The shower plate 26 has a large number of gas dispersion holes 29. Reactive gases introduced through the reactive gas inlet pipe 28 are fed into and dispersed throughout the inner chamber 30 through the gas dispersion holes 29. As a result, the reactive gases are uniformly fed over a substrate 36 placed on a substrate placing table 35.

In the inner chamber 30, an anode 130 is disposed opposite to the cathode 120. The anode 130 has an anode heater 33 and a substrate placing table 35 disposed thereon. A rod-like heater wire 34 for resistance heating is embedded in an aluminum member 131 to form the anode heater 33. The cathode 120 and the anode 130 constitute a so-called parallel plate electrode. The cathode 120 is connected to an RF power supply 46, and the anode 130 is grounded, whereby radio frequency power can be applied between the cathode 120 and the anode 130.

The anode heater 33 is secured to the top ends of elevator rods 42 and rises or lowers as the elevator rods 42 rise or lower. The elevator rods 42 are raised/lowered by air cylinders (not shown). The elevator rods 42 are disposed penetrating the bottom plate 211 of the processing chamber body 21 such that the elevator rods 42 is vertically movable in an airtight manner.

An inner chamber upper wall 31 surrounding the insulator 23 is secured to the bottom surface of the top cover 22 along an peripheral portion thereof. An inner chamber lower wall 32 is secured to the periphery of the anode heater 33 and corresponds to the inner chamber upper wall 31. The inner chamber lower wall 32 rises/lowers as the anode heater 33 rises/lowers. When the anode heater 33 rises, the inner chamber lower wall 32 rises to abut on the inner chamber upper wall 31. The cathode 120, the anode 130, the inner chamber upper wall 31, and the inner chamber lower wall 32 thus compose the inner chamber 30.

In the inner chamber lower wall 32, as shown in FIG. 3, exhaust holes 49 are disposed at predetermined intervals surrounding the entire periphery of the substrate placing table 35. A gas collecting chamber 38 is disposed under the anode heater 33. The upper portion of the side plate 382 of the gas collecting chamber 38 is fixed to the lower portion of the inner chamber lower wall 32. The anode heater 33, the inner chamber lower wall 32, and the gas collecting chamber 38 constitute an exhaust chamber 37, within which an exhaust room 137 is defined. The exhaust room 137 communicates with the inner chamber 30 via the exhaust holes 49. The bottom plate 381 of the gas collecting chamber 38 has an inner exhaust pipe 39 allowing communication with the exhaust room 137. As shown in FIG. 3, the inner exhaust pipe 39 is located at the central portion of the substrate placing table 35 as viewed from above. The processing chamber body 21, the top cover 22, the inner chamber upper wall 31, the inner chamber lower wall 32, the gas collecting chamber 38, and the inner exhaust pipe 39 define an outer chamber space 140.

Lift pins 43 penetrate the substrate placing table 35 and the anode heater 33 in a vertically movable manner. The lift pins 43 are adapted so as to lift the substrate 36 off the substrate placing table 35. The lift pins 43 are secured to the top ends of elevator rods 44, and thus move vertically with the elevator rods 44. The elevator rods 44 are raised/lowered by air cylinders (not shown). The elevator rods 44 penetrate the bottom plate 211 of the processing chamber body 21 in an airtight manner, and vertical movement thereof is permitted.

An outer exhaust pipe 41 is disposed at the central portion of the bottom plate 211 of the processing chamber body 21 such that the outer exhaust pipe 41 communicates with the outer chamber space 140. The inner exhaust pipe 39 is loosely and coaxially fitted into the outer exhaust pipe 41. The inner exhaust pipe 39 is inserted into a hole 216 located at the central portion of the bottom plate 211 of the processing chamber body 21 and into the outer exhaust pipe 41. There is a spacing L1 between the outer wall 391 of the inner exhaust pipe 39 and the inner wall 215 of the hole 216 and between the outer wall 391 and the inner wall 411 of the outer exhaust pipe 41. The spacing L1 is approximately 8.5 mm. As a result of narrowing the spacing L1 like this, particles associated with reaction byproducts can be effectively prevented from flowing back and diffusing into the outer chamber space 140 through the spacing L1. The spacing L1 preferably ranges from 5 mm to 10 mm. The inner wall 215 of the hole 216 and the inner wall 411 of the outer exhaust pipe 41 form a continuous same plane. The diameter of the hole 216 and an inside diameter D2 of the outer exhaust pipe 41 are preferably 60 mm, and an inside diameter D1 of the inner exhaust pipe 39 is preferably 40 mm.

The inner exhaust pipe 39 projects by a length L2 beyond the inner wall 214 of the bottom plate 211. The length L2 is preferably 5 mm. As a result of projecting the inner exhaust pipe 39 by the length L2 beyond the inner wall 214, particles associated with reaction byproducts can be effectively prevented from flowing back and diffusing into the outer chamber space 140 through the spacing between the inner exhaust pipe 39 and the hole 216 and between the inner exhaust pipe 39 and the outer exhaust pipe 41. The length L2 preferably ranges from 3 mm to 8 mm.

The outer exhaust pipe 41 is connected to a vacuum pump (not shown). A pressure regulating valve (not shown) is provided somewhere in a line of the outer exhaust pipe 41.

A pressure detector 45 is disposed such that it penetrates the peripheral portion of the top cover 22 and communicates with the outer chamber space 140.

Side plates 212 and 213 of the processing chamber body 21 have substrate loading/unloading openings 48 and 148, respectively. Gate valves 47 and 147 are attached to the substrate loading/unloading openings 48 and 148, respectively.

At the time of film deposition or at the time of gas etching, the inner chamber 30 is exhausted through the exhaust holes 49, the exhaust room 137, the inner exhaust pipe 39 and the outer exhaust pipe 41. The outer chamber space 140 is exhausted through the spacing between the outer wall 391 of the inner exhaust pipe 39 and the inner wall 215 of the hole 216 in the bottom plate 211 and between the outer wall 391 and the inner wall 411 of the outer exhaust pipe 41 and through the outer exhaust pipe 41. While evacuating the inner chamber 30 and the outer chamber space 140, reactive gases for depositing a film or for gas etching are introduced into the inner chamber 30 through the reactive gas inlet pipe 28. The inner chamber 30 and the outer chamber space 140 are thus controlled at a predetermined pressure.

At this time, the pressure of the outer chamber space 140 is measured by the pressure detector 45, and the corresponding measurement obtained by the pressure detector 45 is input to a pressure controller (not shown). The pressure controller regulates the opening degree of a pressure regulating valve (not shown) so that the pressure measured by the pressure detector 45 becomes a preset target value. The pressure of the inner chamber 30 is indirectly controlled by controlling the pressure of the outer chamber space 140. The pressure difference between the inner chamber 30 and the outer chamber space 140 is determined by the conductance of the outer exhaust pipe 41, the conductance of the inner exhaust pipe 39, the conductance of the exhaust room 137, the conductance of the exhaust holes 49, the conductance of the spacing between the inner exhaust pipe 39 and the hole 216 in the bottom plate 211 and between the inner exhaust pipe 39 and the outer exhaust pipe 41, and the flow rate of reactive gases led in through the reactive gas inlet pipe 28. Accordingly, by previously obtaining these conductances, the pressure of the inner chamber 30 can be controlled in a highly accurate manner.

Since the pressure of the outer chamber space 140 is reduced as described above, heat radiation from the inner chamber 30 is suppressed. As a result, the inner chamber 30 can be maintained at a hot wall state, and hence reaction byproducts, which will easily separate, are not generated on the inner wall of the inner chamber 30, thereby preventing the generation of particles.

The inner chamber lower wall 32 is secured to the anode heater 33, and the gas collecting chamber 38 is secured to the inner chamber lower wall 32. Accordingly, heat from the anode heater 33 is also transferred to the inner chamber lower wall 32 and to the gas collecting chamber 38, whereby the exhaust chamber 37 comprising the anode heater 33, the inner chamber lower wall 32, and the gas collecting chamber 38 can also be maintained at a hot wall sate. Thus, reaction byproducts, which will easily separate, are not generated on the inner wall of the exhaust chamber 37, thereby preventing the generation of particles.

The inner chamber 30 described above causes plasma, which is generated while depositing a film or performing a gas cleaning, to be confined to the inner chamber 30. This increases the density of plasma with a resultant improvement in efficiency of depositing films and of performing gas etching.

Reactive gases flowing out from the inner chamber 30 through the exhaust holes 49 disposed in the inner chamber lower wall 32 enter the exhaust room 137. Then, the reactive gases flow through the inner exhaust pipe 39 and subsequently flows out into a portion of the outer exhaust pipe 41, the portion which is located outwardly beyond the inner wall 214 of the bottom plate 211 of the processing chamber body 21. This prevents the reactive gas, reaction byproducts, etching residue and the like from flowing into the outer chamber space 140, and hence prevents reaction byproducts from adhering to the inner wall of the outer chamber 40.

Accordingly, there is no need for cleaning the outer chamber 40 during maintenance, thereby improving the availability of the plasma CVD apparatus 100 accordingly.

As shown in FIG. 3, the inner exhaust pipe 39 is located at the central portion of the substrate placing table 35 as viewed from above, and hence the inner chamber 30 is almost uniformly exhausted through a plurality of exhaust holes 49 in the inner chamber lower wall 32. Accordingly, the gases flow uniformly over the substrate 36 placed on the substrate placing table 35, whereby a film deposited on the substrate 36 has uniform thickness and characteristics. This improves yield and productivity.

Further, an adequately large distance H1, about 50 mm, is taken between a bottom surface 132 of the anode heater 33 and a top face 383 of the bottom plate 381 of the gas collecting chamber 38. Accordingly, the ratio between a distance L3 and a distance L4 can be made smaller, where the distance L3 is the one between the inner exhaust pipe 39 and an exhaust hole 491 or 492 which is an exhaust hole 49 most distant from the inner exhaust pipe 39 and where the distance L4 is the one between the inner exhaust pipe 39 and an exhaust hole 493 or 494 which is an exhaust hole 49 nearest to the inner exhaust pipe 39. The inner chamber 30, therefore, is exhausted more uniformly through a plurality of the exhaust holes 49 in the inner chamber lower wall 32.

Figure 1:
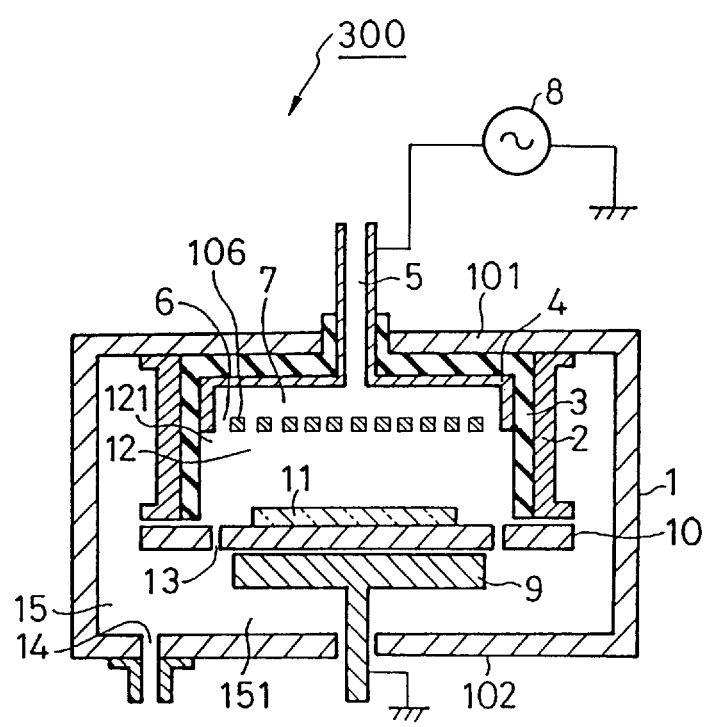
FIG. 1 is a schematic cross-sectional view for explaining a conventional plasma CVD apparatus.

In the conventional plasma CVD apparatus 300 shown in FIG. 1, the gas which has been led into the inner chamber 12 through the reactive gas inlet pipe 5 flows out into the outer chamber space 151 via the inner chamber exhaust holes 13. Then, the gas flows out of the processing chamber 1 through the outer chamber exhaust hole 14 located at one corner of the bottom plate 102 of the processing chamber 1. Thus, the gas in the inner chamber 12 flows out more through the inner chamber exhaust holes 13 near the outer chamber exhaust hole 14 and flows out less through the inner chamber exhaust holes 13 distant from the outer chamber exhaust hole 14. This causes nonuniformed gas flow distribution within the inner chamber 12. This nonuniformity increases as the flow rate of the gas released through the outer chamber exhaust hole 14 increases as a result of increasing the flow rate of the gas fed through the reactive gas inlet pipe 5. Increasing the gas flow rate is quite important in terms of a speedup of film deposition and gas cleaning, which leads to an improvement in the availability of the CVD apparatus and productivity. In the plasma CVD apparatus 300 shown in FIG. 1, however, increasing the gas flow rate causes a problem that the nonuniformity of a gas flow also increases.

By contrast, in the plasma CVD apparatus 100 according to the present embodiment, the inner exhaust pipe 39 is located at the central portion of the substrate placing table 35 as viewed from above, and hence even when the gas flow rate is increased, the inner chamber 30 is almost uniformly exhausted through a plurality of exhaust holes 49 in the inner chamber lower wall 32. Accordingly, the gas flows uniformly above the substrate 36. Further, the inner exhaust pipe 39 is inserted into the outer exhaust pipe 41, and hence the inner chamber 30 can be efficiently exhausted through the outer exhaust pipe 41. This feature allows the CVD apparatus 100 to cope with a larger gas flow rate and thereby increase productivity.

The inner exhaust pipe 39 is preferably positioned at the central portion of the substrate placing table 35. However, the inner exhaust pipe 39 may be positioned anywhere within a circle which is centered at the central portion of the substrate placing table 35 and which has a diameter of L/2 or less, where L is the maximum distance between opposed exhaust holes 49, in this case, the distance between the exhaust holes 491 and 492 located diagonally. This allows the inner chamber 30 to be almost uniformly exhausted through a plurality of exhaust holes 49 in the inner chamber lower wall 32. Accordingly, the gas flows uniformly over the substrate 36 placed on the substrate placing table 35, whereby a film deposited on the substrate 36 has substantially uniform thickness and characteristics. If the inner exhaust pipe 39 is provided at a position separated from the center of the substrate placing table 35 by a distance greater than L/4, the uniformity of film thickness and characteristics will deteriorate.

The pressure detector 45 communicates with the outer chamber space 140. Accordingly, the pressure detector 45 is not exposed to plasma and is free from the adhesion of reaction byproducts, thereby preventing a deterioration of the accuracy of pressure detection due to elapse of time.

Also, the outer chamber 40 facilitates the connection between the plasma CVD apparatus 100 and any other chamber like a load-lock chamber.

The operation of the plasma CVD apparatus 100 having the above described structure will now be described.

When the substrate 36 is loaded, the elevator rods 42 are lowered by the air cylinders (not shown) to lower the anode heater 33, the substrate placing table 35, the inner chamber lower wall 32, and the gas collecting chamber 38, thereby opening the inner chamber 30. Also, the elevator rods 44 are raised by the air cylinders (not shown) to project the lift pins beyond the substrate placing table 35. The processing chamber 20 is evacuated to a predetermined degree of vacuum through the outer exhaust pipe 41 and the inner exhaust pipe 39.

The gate valve 47 is opened, and then the substrate 36 is loaded into the inner chamber 30 through the substrate loading/unloading opening 48 and placed on the lift pins 43 using a loader-unloader (not shown). After the loader-unloader retreats outside the processing chamber 20, the gate valve 47 is closed. Subsequently, the elevator rods 44 are lowered by the air cylinders (not shown) to place the substrate 36 on the substrate placing table 35. Then, the elevator rods 42 are raised by the air cylinders (not shown) to raise the anode heater 33, the substrate placing table 35, the inner chamber lower wall 32, and the gas collecting chamber 38, whereby the top portion of the inner chamber lower wall 32 abuts on the lower portion of the inner chamber upper wall 31 to close the inner chamber 30.

Then, the inner chamber 30 is exhausted through the exhaust holes 49 in the inner chamber lower wall 32, the exhaust room 137, the inner exhaust pipe 39, and the outer exhaust pipe 41. The outer chamber space 140 is exhausted through the spacing between the outer wall 391 of the inner exhaust pipe 39 and the inner wall 215 of the hole 216 in the bottom plate 211 and between the outer wall 391 and the inner wall 411 of the outer exhaust pipe 41 and through the outer exhaust pipe 41. While exhausting the inner chamber 30 and the outer chamber space 140, the reactive gases for depositing a film are let preferably into the inner chamber 30 through the reactive gas inlet pipe 28. The pressure of the inner chamber 30 and the outer chamber space 140 is thus controlled to be a predetermined pressure. Concurrently, radio frequency power is applied between the cathode 120 and the anode 130 to generate a plasma and deposit a film on the substrate 36. During depositing a film, the reactive gases and reaction byproducts are directly ejected into the outer exhaust pipe 41 through the exhaust holes 49, the exhaust room 137, and the inner exhaust pipe 39.

On completion of depositing a film, the feed of the reactive gases is stopped, and the inner chamber 30 and the outer chamber space 140 are exhausted through the inner exhaust pipe 39, the outer exhaust pipe 41 and the like.

Subsequently, the anode heater 33 is lowered, and the lift pins 43 are raised, whereby the substrate 36 is lifted off the substrate placing table 35.

Then, the gate valve 147 is opened, and the substrate 36 is unloaded through the substrate loading/unloading opening 148 using a loader-unloader (not shown).

For performing gas cleaning, the elevator rods 42 are raised without placing the substrate 36 on the substrate placing table 35 to raise the anode heater 33, the substrate placing table 35, the inner chamber lower wall 32, and the gas collecting chamber 38, whereby the upper portion of the inner chamber lower wall 32 abuts on the lower portion of the inner chamber upper wall 31 to close the inner chamber 30.

Then, the inner chamber 30 is exhausted through the exhaust holes 49 in the inner chamber lower wall 32, the exhaust room 137, the inner exhaust pipe 39, and the outer exhaust pipe 41. The outer chamber space 140 is exhausted through the spacing between the outer wall 391 of the inner exhaust pipe 39 and the inner wall 215 of the hole 216 in the bottom plate 211 and between the outer wall 391 and the inner wall 411 of the outer exhaust pipe 41 and through the outer exhaust pipe 41. Concurrently, a cleaning gas such as $NF_3$ is led into the inner chamber 30, and the pressure of the inner chamber 30 and the outer chamber space 140 is thus controlled to be a predetermined pressure. Also, radio frequency power from the RF power supply 46 is applied between the cathode 120 and the anode 130 so as to generate plasma for removing in an etching manner reaction byproducts which have adhered to or deposited on the inner wall of the inner chamber 30. In gas cleaning, the residue of cleaning is directly ejected into the outer exhaust pipe 41 through the exhaust holes 49, the exhaust room 137, and the inner exhaust pipe 39. On completion of gas cleaning, the feed of the cleaning gas is stopped, and the inner chamber 30 and the outer chamber space 140 are exhausted through the inner exhaust pipe 39, the outer exhaust pipe 41 and the like.

(Second embodiment)

Figure 4:
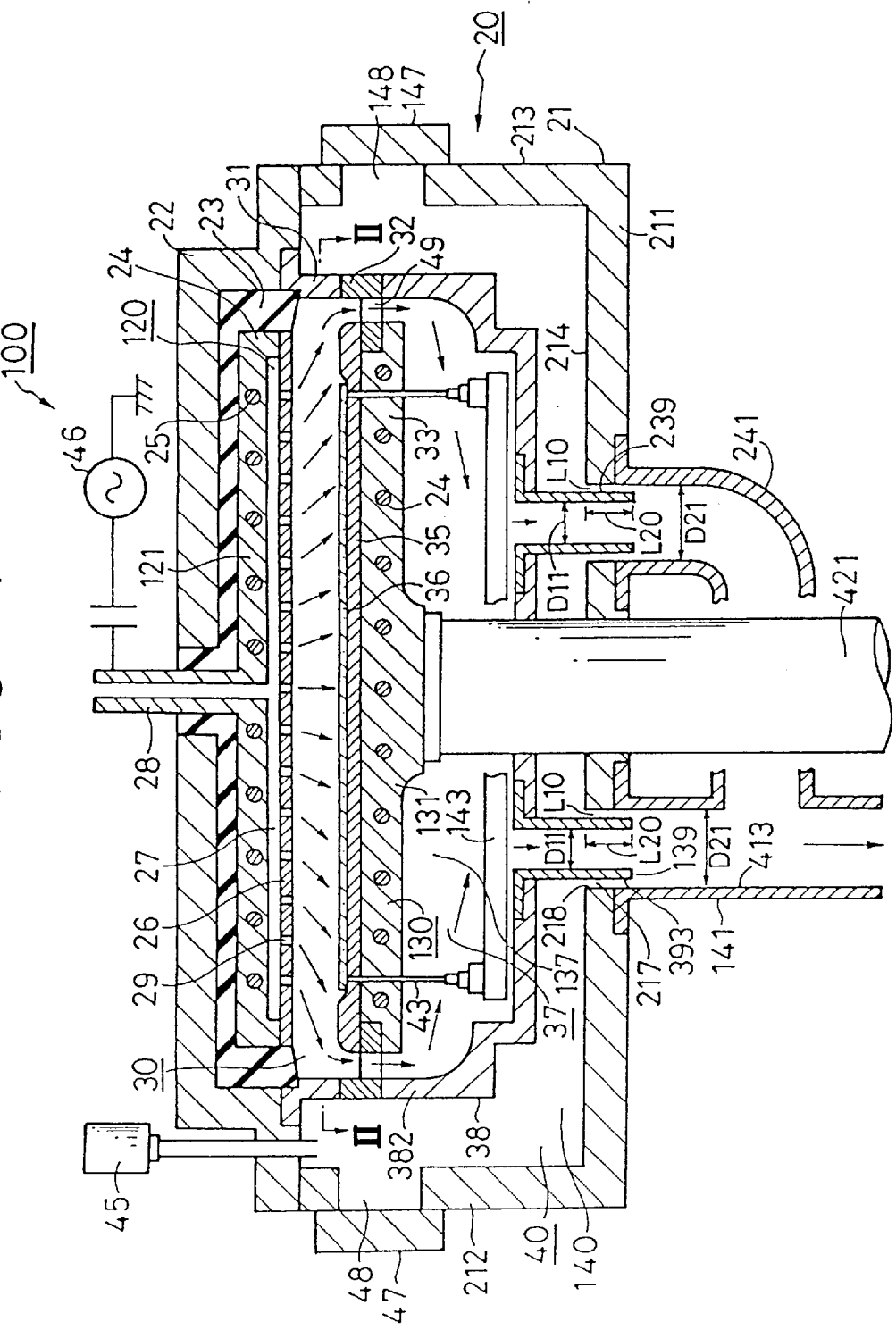
FIG. 4 is a cross-sectional view for explaining a plasma CVD apparatus according to a second embodiment of the present invention.
Figure 5:
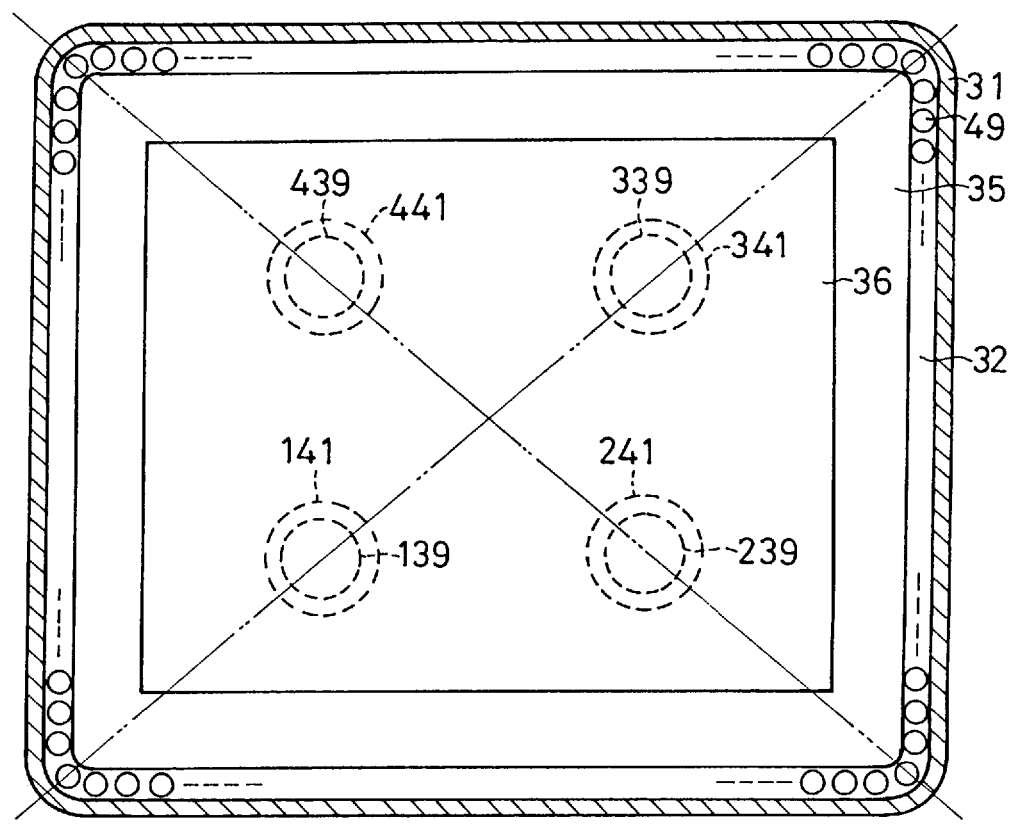
FIG. 5 is a cross-sectional view along the line II—II of FIG. 4.

FIGS. 4 and 5 show a plasma CVD apparatus 100 according to a second embodiment of the present invention.

In the plasma CVD apparatus according to the present embodiment, an elevator rod 421 for raising/lowering an anode heater 33 is disposed at the central portion of the anode heater 33. Accordingly, the thermal expansion, if any, of the anode heater 33 does not affect the vertical movement of the elevator rod 421.

Four inner exhaust pipes 139, 239, 339, and 439 are disposed. The inner exhaust pipes 139, 239, 339, and 439 are located on the diagonals of a substrate placing table 35, on those lines passing through the center and four corners of the substrate placing table 35, at the same distance from the center of the substrate placing table 35. Accordingly, exhaust through a plurality of exhaust holes 49 in an inner chamber lower wall 32 surrounding the substrate placing table 35 is divided into four corresponding to the inner exhaust pipes 139, 239, 339, and 439. Further, the exhaust holes 49 associated with each of the inner exhaust pipes 139, 239, 339, and 439 are arranged at a substantially equal distance from each of the inner exhaust pipes 139, 239, 339, and 439. The inner chamber 30, therefore, is uniformly exhausted through each of the exhaust holes 49 in the inner chamber lower wall 32. Accordingly, the gas flows uniformly over a substrate 36 placed on the substrate placing table 35, whereby a film deposited on the substrate 36 has uniform thickness and characteristics. This improves yield and productivity.

Outer exhaust pipes 141, 241, 341, and 441 are attached to a bottom plate 211 of a processing chamber body 21 in those positions corresponding to the inner exhaust pipes 139, 239, 339, and 439, respectively. The outer exhaust pipes 141, 241, 341, and 441 communicate with an outer chamber space 140. The inner exhaust pipes 139, 239, 339, and 439 are loosely and coaxially fitted into the outer exhaust pipes 141, 241, 341, and 441, respectively. Of the inner exhaust pipes 139, 239, 339, and 439, only the inner exhaust pipe 139 will be described hereinafter. The remaining inner exhaust pipes 239, 339, and 439 have the same structure as the inner exhaust pipe 139. The inner exhaust pipe 139 is inserted into a hole 217 formed in the bottom plate 211 of the processing chamber body 21 and into the outer exhaust pipe 141. There is a spacing L10 between the outer wall 393 of the inner exhaust pipe 139 and the inner wall 218 of the hole 217 and between the outer wall 393 and the inner wall 413 of the outer exhaust pipe 141. The spacing L10 is about 4.5 mm. As a result of narrowing the spacing L10 like this, particles associated with reaction byproducts can be effectively prevented from flowing back and diffusing into the outer chamber space 140 through the spacing L10. The spacing L10 preferably ranges from 3 mm to 6 mm. The inner wall 217 of the hole 211 and the inner wall 413 of the outer exhaust pipe 141 form a continuous same plane. The diameter of the hole 217 and an inside diameter D21 of the outer exhaust pipe 141 are preferably 33 mm, and an inside diameter D11 of the inner exhaust pipe 139 is preferably 21 mm.

The inner exhaust pipe 139 projects by a length L20 beyond the inner wall 214 of the bottom plate 211. The length L20 is 5 mm. As a result of projecting the inner exhaust pipe 139 by the length L20 beyond the inner wall 214, particles associated with reaction byproducts can be effectively prevented from flowing back and diffusing into the outer chamber space 140 through the spacing between the inner exhaust pipe 139 and the hole 217 of the bottom plate 211 and between the inner exhaust pipe 139 and the outer exhaust pipe 141. The length L20 preferably ranges from 3 mm to 8 mm.

The reactive gases flowing out from the inner chamber 30 through the exhaust holes 49 in the inner chamber lower wall 32 enter an exhaust room 137. Then, the reactive gases flow through the inner exhaust pipes 139, 239, 339, and 439 and then flow out into portions of the outer exhaust pipes 141, 241, 341, and 441, respectively, the portions which are located outwardly beyond the inner wall 214 of the bottom plate 211 of the processing chamber body 21. This prevents the reactive gases, reaction byproducts, etching residue and the like from flowing into the outer chamber space 140, and hence prevents reaction byproducts from adhering to the inner wall of an outer chamber 40. Accordingly, there is no need for cleaning the outer chamber 40 at the time of maintenance, thereby improving the availability of the plasma CVD apparatus 100 accordingly.

The external exhaust pipes 241, 341, and 441 are connected to the intermediate portion of the outer exhaust pipe 141. The outer exhaust pipe 141 is connected to a vacuum pump (not shown). A pressure regulating valve (not shown) is provided somewhere in a line of the outer exhaust pipe 141.

Further, in the plasma CVD apparatus 100 according to the present embodiment, a plurality of lift pins 43 are mounted on a lift pin supporting member 143, and the lift pin supporting member 143 is raised/lowered so as to raise/lower the substrate 36.

The second embodiment is different from the first embodiment in the above mentioned points, but the other features are the same.

(Third embodiment)

Figure 6:
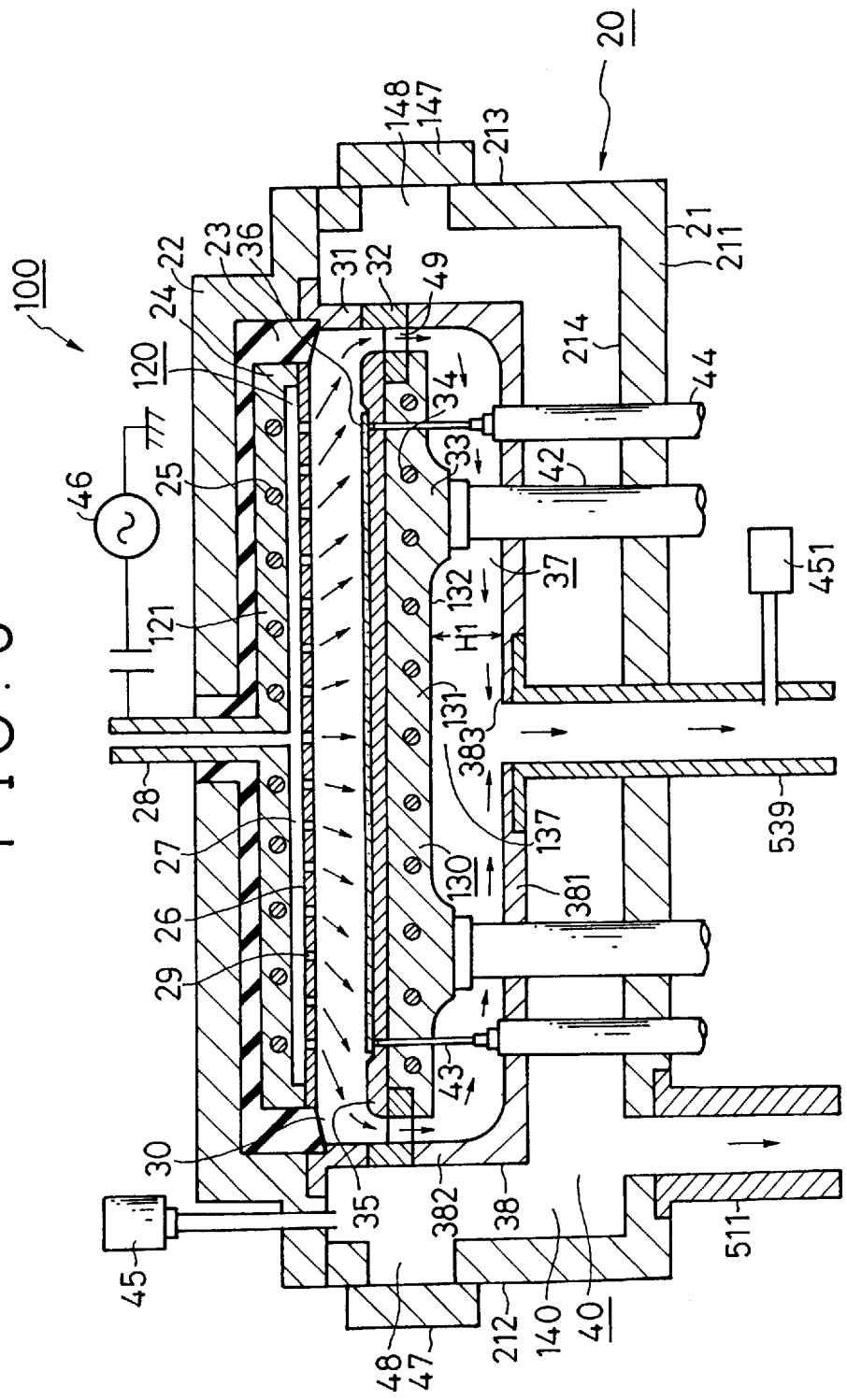
FIG. 6 is a cross-sectional view for explaining a plasma CVD apparatus according to a third embodiment of the present invention.

FIG. 6 shows a plasma CVD apparatus 100 according to a third embodiment of the present invention.

In the first and second embodiments, the inner exhaust pipe 39 is loosely fitted into the external exhaust pipe 41, so that the inner chamber 30 is also exhausted through the outer exhaust pipe 41. By contrast, in the plasma CVD apparatus 100 according to the present embodiment, an inner exhaust pipe 539 passes through the bottom plate 211 of a processing chamber body 21 and extends outside the processing chamber body 21. Also, an outer exhaust pipe 511 is attached to the bottom plate 211 at a separate position such that the outer exhaust pipe communicates with an outer chamber space 140. That is, a different exhaust line is provided for each of the inner chamber 30 and an outer chamber 40. A pressure detector 451 is provided separately at the exhaust line of the inner chamber 30 so as to measure the pressure of the inner chamber 30. Other features are the same as those of the first and second embodiments.

(Fourth embodiment)

Figure 7:
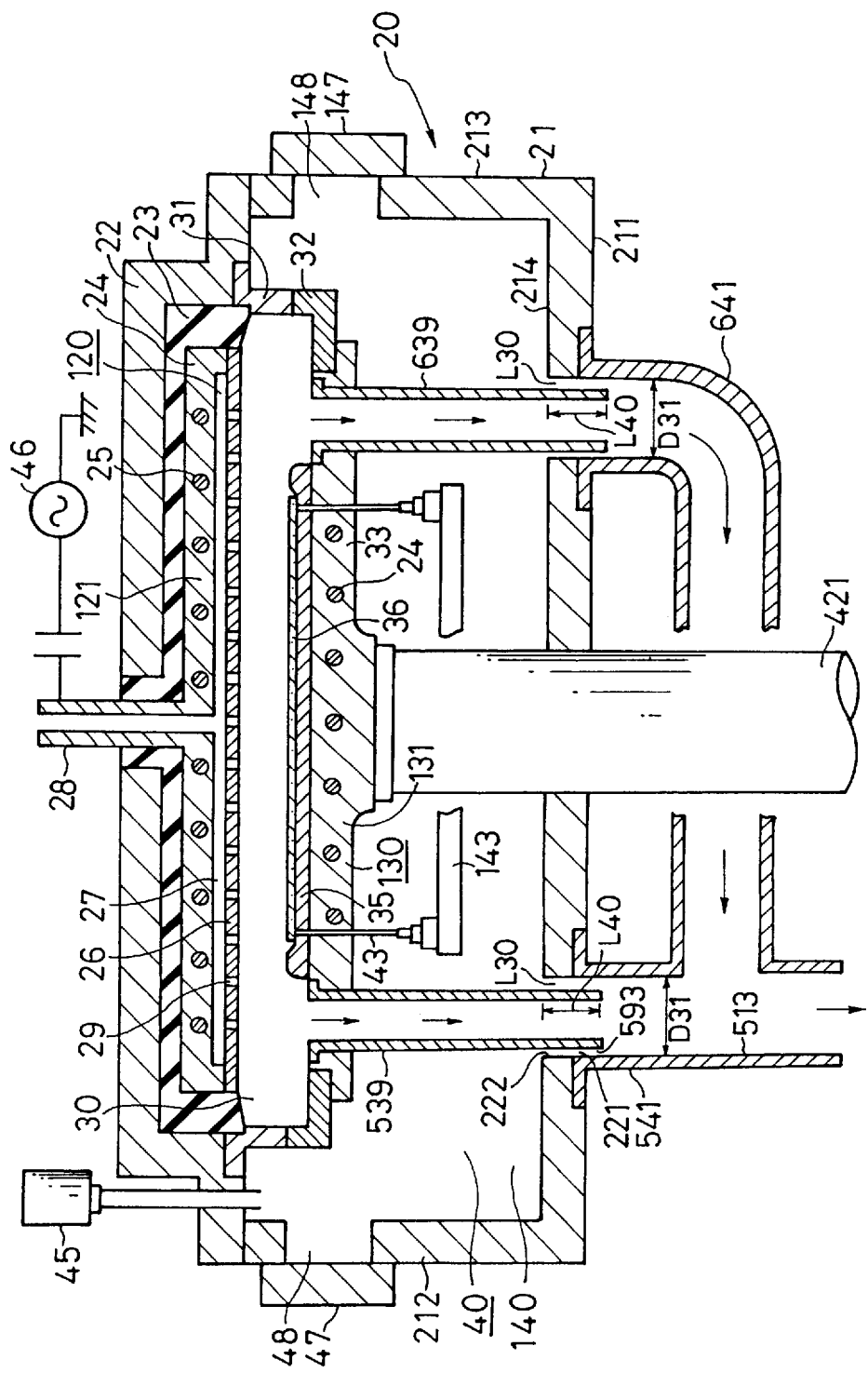
FIG. 7 is a cross-sectional view for explaining a plasma CVD apparatus according to a fourth embodiment of the present invention.

FIG. 7 shows a plasma CVD apparatus 100 according to a fourth embodiment of the present invention.

In the second embodiment, the exhaust chamber 37 and the exhaust holes 49 are provided, and the inner chamber 30 is exhausted through the exhaust holes 49 and the exhaust chamber 37. By contrast, in the present embodiment, inner exhaust pipes 539 and 639 directly communicate with an inner chamber 30 without providing the exhaust chamber 37 and the exhaust holes 49, whereby the inner chamber 30 is exhausted through the inner exhaust pipes 539 and 639 and outer exhaust pipes 541 and 641. Other features are the same as those of the second embodiment.

Also, in the present embodiment, the inner exhaust pipes 539 and 639 are coaxially and loosely fitted into the outer exhaust pipes 541 and 641, respectively. Of the inner exhaust pipes 539 and 639, the inner exhaust pipe 539 will be described hereinafter. The inner exhaust pipe 639 has the same structure as the inner exhaust pipe 539. The inner exhaust pipe 539 is inserted into a hole 221 in the bottom plate 211 of a processing chamber body 21 and into the outer exhaust pipe 541. There is a spacing L30 between the outer wall 593 of the inner exhaust pipe 539 and the inner wall 222 of the hole 221 of the bottom plate 211 and between the outer wall 593 and the inner wall 513 of the outer exhaust pipe 541. By narrowing the spacing L30, particles associated with reaction byproducts can be effectively prevented from flowing back and diffusing into an outer chamber space 140 through the spacing L30. The inner wall 222 of the hole 221 and the inner wall 513 of the outer exhaust pipe 541 form a continuous same plane.

The inner exhaust pipe 539 projects by a length L40 beyond the inner wall 214 of the bottom plate 211. As a result of projecting the inner exhaust pipe 539 by the length L40 beyond the inner wall 214, particles associated with reaction byproducts can be effectively prevented from flowing back and diffusing into the outer chamber space 140 through the spacing between the inner exhaust pipe 539 and the hole 221 of the bottom plate 211 and between the inner exhaust pipe 539 and the outer exhaust pipe 541.

The reactive gases flowing out from the inner chamber 30 flow through the inner exhaust pipes 539 and 639 and then flow out into portions of the outer exhaust pipes 541 and 641, respectively, the portions which are located outwardly beyond the inner wall 214 of the bottom plate 211 of the processing chamber body 21. This prevents the reactive gases, reaction byproducts, etching residue and the like from flowing into the outer chamber space 140, and hence prevents reaction byproducts from adhering to the inner wall of an outer chamber 40. Accordingly, there is no need for cleaning the outer chamber 40 at the time of maintenance, thereby improving the availability of the plasma CVD apparatus 100 accordingly.

The external exhaust pipe 641 is connected to the intermediate portion of the outer exhaust pipe 541. The outer exhaust pipe 541 is connected to a vacuum pump (not shown). A pressure regulating valve (not shown) is provided somewhere in a line of the outer exhaust pipe 541.

The depositing of a film by the plasma CVD method using the plasma CVD apparatus 100 of the present invention will now be described by way of example.

(First example)

Using the plasma CVD apparatus 100 according to the first embodiment of the present invention as shown in FIGS. 2 and 3, a glass substrate 36 measuring 350 mm×450 mm×1.1 mm (thickness) was placed on the substrate placing table 35. $SiH_4$, $NH_3$ and $N_2$ were fed through the reactive gas inlet pipe 28 to deposit a silicon nitride film (SiN film) onto the glass substrate 36. While the ratio among flow rates of the gases was held fixed, total flow rates were changed to evaluate the uniformity of a film thickness and a film deposition rate. During depositing films, radio frequency power applied was tailored for all of the gas flow rates, and a pressure at the time of film forming was 0.4 Torr. The inner area of the glass substrate excluding the portion as wide as 10 mm as measured from edges thereof was divided into 25 zones. The film thickness of each zone was measured using an optical film thickness meter to evaluate the uniformity of the film thickness. The uniformity of a film thickness was obtained by the following formula:

Uniformity of film thickness=[(maximum film thickness−minimum film thickness)/(maximum film thickness+minimum film thickness)]×100

In order to obtain a film deposition rate, a deposited film was separated from the substrate using etching solution to obtain its thickness, and thus obtained film thickness was divided by a film deposition time.

Results of the above described measurement are shown in Table 1.

(Second example)

Using the plasma CVD apparatus 100 according to the second embodiment of the present invention, films were deposited in the same manner as in the first example, and the uniformity of a film thickness and a film deposition rate were obtained. Results of the measurement are shown in Table 2.

TABLE 1

| Gas Flow Rate (SCCM) | | | RF power | Film Forming Pressure | Uniformity of Film Thickess | Film Deposition Rate |
|---|---|---|---|---|---|---|
| SiH$_4$ | NH$_3$ | N$_2$ | (watt) | (Torr) | (±%) | (Å/min) |
| 40 | 120 | 480 | 500 | 0.4 | 7.0 | 490 |
| 50 | 150 | 600 | 600 | 0.4 | 6.5 | 570 |
| 60 | 180 | 720 | 700 | 0.4 | 4.1 | 740 |
| 70 | 210 | 840 | 800 | 0.4 | 2.5 | 990 |
| 80 | 240 | 960 | 1000 | 0.4 | 2.9 | 1180 |
| 90 | 270 | 1080 | 1200 | 0.4 | 3.1 | 1380 |
| 100 | 300 | 1200 | 1400 | 0.4 | 3.2 | 1520 |

TABLE 2

| Gas Flow Rate (SCCM) | | | RF power | Film Forming Pressure | Uniformity of Film Thickess | Film Deposition Rate |
|---|---|---|---|---|---|---|
| SiH$_4$ | NH$_3$ | N$_2$ | (watt) | (Torr) | (±%) | (Å/min) |
| 40 | 120 | 480 | 500 | 0.4 | 6.0 | 490 |
| 50 | 150 | 600 | 600 | 0.4 | 6.2 | 590 |
| 60 | 180 | 720 | 700 | 0.4 | 5.8 | 730 |
| 70 | 210 | 840 | 800 | 0.4 | 3.5 | 1020 |
| 80 | 240 | 960 | 1000 | 0.4 | 3.8 | 1150 |
| 90 | 270 | 1080 | 1200 | 0.4 | 4.5 | 1350 |
| 100 | 300 | 1200 | 1400 | 0.4 | 4.5 | 1490 |

(Comparative example)

Using the conventional plasma CVD apparatus shown in FIG. 1, films were deposited in the same manner as in the first example, and the uniformity of a film thickness and a film deposition rate were obtained. Results of the measurement are shown in Table 3.

TABLE 3

| Gas Flow Rate (SCCM) | | | RF power | Film Forming Pressure | Uniformity of Film Thickess | Film Deposition Rate |
|---|---|---|---|---|---|---|
| SiH$_4$ | NH$_3$ | N$_2$ | (watt) | (Torr) | (±%) | (Å/min) |
| 40 | 120 | 480 | 500 | 0.4 | 5.0 | 480 |
| 50 | 150 | 600 | 600 | 0.4 | 7.5 | 610 |
| 60 | 180 | 720 | 700 | 0.4 | 9.8 | 780 |
| 70 | 210 | 840 | 800 | 0.4 | 15.0 | 1030 |
| 80 | 240 | 960 | 1000 | 0.4 | 16.1 | 1190 |
| 90 | 270 | 1080 | 1200 | 0.4 | 18.0 | 1380 |
| 100 | 300 | 1200 | 1400 | 0.4 | 20.5 | 1560 |

As seen from the Tables 1 to 3, the plasma CVD apparatus of the present invention provides an excellent uniformity of a film thickness even at high film deposition rates.

Figure 8:
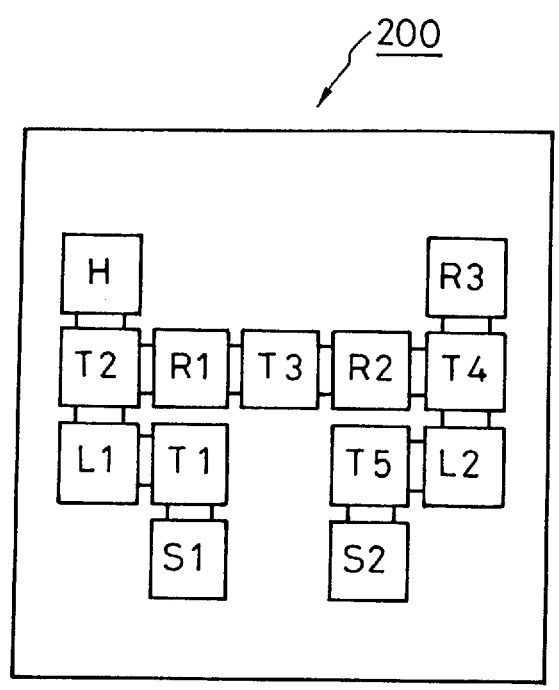
FIG. 8 is block diagram for explaining an example of a single substrate processing type plasma CVD apparatus for LCD in which the plasma CVD apparatus of the present invention is used.

FIG. 8 is a block diagram illustrating a single substrate processing type plasma CVD apparatus for LCD 200 in which the plasma CVD apparatus of the present invention is used.

The single substrate processing type plasma CVD apparatus for LCD 200 includes cassette stands S1 and S2, transfer robots T1 and T5 for atmospheric use, transfer robots T2, T3, and T4 for vacuum use, load lock chambers L1 and L2, film deposition chambers R1, R2, and R3, and a substrate heating chamber H. The plasma CVD apparatus 100 of the invention is used as the film deposition chambers R1, R2, and R3.

A cassette (not shown) capable of housing typically up to 20 glass substrates is placed at the cassette stand S1. The transfer robot T1 for atmospheric use takes one glass substrate out from the cassette (not shown) at the cassette stand S1 and transfers it to the load lock chamber L1. Then, after reducing the pressure of the load lock chamber L1 from the atmospheric pressure to vacuum, the transfer robot T2 for vacuum use transfers the glass substrate to the substrate heating chamber H. In the substrate heating chamber H, the glass substrate is heated to a film deposition temperature. Subsequently, the transfer robot T2 for vacuum use transfers the glass substrate to the film deposition chamber R1 which uses the plasma CVD apparatus of the present invention. In the film deposition chamber R1, for example, an SiN (silicon nitride) film deposition is performed. Then, the transfer robot T3 for vacuum use transfers the film-deposited glass substrate to the film deposition chamber R2 which uses the plasma CVD apparatus of the present invention. In the film deposition chamber R2, for example, an a-Si (amorphous silicon) film deposition is performed as in the film deposition chamber R1. Subsequently, the transfer robot T4 for vacuum use transfers the film-deposited glass substrate to the film deposition chamber R3 which uses the plasma CVD apparatus of the present invention. In the film deposition chamber R3, for example, an n$^+$ a-Si (doped amorphous silicon) film deposition is performed as in the film deposition chamber R1. Then, the transfer robot T4 for vacuum use transfers the film-deposited glass substrate to the load lock chamber L2. In the load lock chamber L2, the film-deposited glass substrate is cooled, and concurrently, the chamber pressure is restored from vacuum to the atmospheric pressure. Subsequently, the transfer robot T5 for atmospheric use places the film-deposited glass substrate in a cassette (not shown) placed at the cassette stand S2.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A substrate processing apparatus comprising:

an outer chamber having an exhaust hole;

an inner chamber disposed in said outer chamber, said inner chamber having a first side and a second side disposed opposite to said first side;

a reactive gas inlet pipe communicating with said inner chamber at said first side;

a first exhaust pipe disposed to be capable of communicating with said inner chamber at said second side, said first exhaust pipe extending at least to an inner wall surface of said outer chamber; and a second exhaust pipe communicating with the exhaust hole.

2. A substrate processing apparatus as recited in claim 1, wherein said substrate processing apparatus is a plasma CVD apparatus.

3. A substrate processing apparatus, comprising:

an outer chamber having an exhaust hole;

an inner chamber disposed in said outer chamber;

a reactive gas inlet pipe communicating with said inner chamber;

a first exhaust pipe disposed to be capable of communicating with said inner chamber, said first exhaust pipe extending at least to an inner wall surface of said outer chamber; and a second exhaust pipe communicating with the exhaust hole, wherein the forward end of said first exhaust pipe is inserted into the exhaust hole, the forward end of said first exhaust pipe projects outward beyond the inner wall surface of said outer chamber, and a spacing is formed between said first exhaust pipe and the exhaust hole.

4. A substrate processing apparatus as recited in claim 2, further comprising a pressure detector communicating with said outer chamber.

5. A substrate processing apparatus as recited in claim 3, wherein said substrate processing apparatus is a plasma CVD apparatus.

6. A substrate processing apparatus comprising:

an outer chamber having an exhaust hole;

an inner chamber disposed in said outer chamber;

a reactive gas inlet pipe communicating with said inner chamber;

a first exhaust pipe disposed to be capable of communicating with said inner chamber, said first exhaust pipe extending at least to an inner wall surface of said outer chamber;

a second exhaust pipe communicating with the exhaust hole;

a first exhaust line having said second exhaust pipe; and a second exhaust line having said first exhaust pipe and being capable of being exhausted independently of said first exhaust line.

7. A substrate processing apparatus as recited in claims 6, wherein said substrate processing apparatus is a plasma CVD apparatus.

8. A substrate processing apparatus as recited in claim 6, further comprising:

one or more third exhaust pipes disposed to be capable of communicating with said inner chamber, said one or more third exhaust pipes extending at least to the inner wall surface of said outer chamber;

a substrate placing portion disposed in said inner chamber, said inner chamber having a plurality of second exhaust holes surrounding said substrate placing portion; and an exhaust chamber disposed in said outer chamber, said exhaust chamber being disposed under said inner chamber, said inner chamber communicating with said exhaust chamber through the second exhaust holes, and said first exhaust pipe and said one or more third exhaust pipes communicating with said exhaust chamber.

9. A substrate processing apparatus as recited in claim 6, wherein said substrate processing apparatus is a plasma processing apparatus, said outer chamber has a lower outer chamber and an upper outer chamber, one of a cathode and an anode is mounted in said upper outer chamber, an inner chamber upper wall is mounted on said upper outer chamber such that the inner chamber upper wall surrounds said one of the cathode and the anode, the other of the cathode and the anode is disposed in said outer chamber in a vertically movable manner, said the other of the cathode and the anode has a substrate placing portion, an inner chamber lower wall corresponding to the inner chamber upper wall is provided around said the other of the cathode and the anode, a plurality of second exhaust holes are formed in the inner chamber lower wall such that the second exhaust holes surround the substrate placing portion, the second exhaust holes being capable of communicating with said first exhaust pipe, the cathode, the anode, the inner chamber upper wall and the inner chamber lower wall form said inner chamber when said the other of the cathode and the anode rises, and when said the other of the cathode and the anode rises to form said inner chamber, said first exhaust pipe extends at least to the inner wall surface of said outer chamber.

10. A substrate processing apparatus as recited in claim 9, further comprising an exhaust chamber disposed in said outer chamber, wherein said exhaust chamber is disposed under said the other of the cathode and the anode, said inner chamber communicates with said exhaust chamber through the second exhaust holes, and said first exhaust pipe communicates with said exhaust chamber.

11. A substrate processing apparatus as recited in claim 6, further comprising:

a substrate placing portion disposed in said inner chamber, wherein said inner chamber has a plurality of second exhaust holes surrounding said substrate placing portion, the plurality of second exhaust holes being capable of communicating with said first exhaust pipe.

12. A substrate processing apparatus as recited in claim 11, further comprising an exhaust chamber disposed in said outer chamber, wherein said exhaust chamber is disposed under said inner chamber, said inner chamber communicates with said exhaust chamber through the second exhaust holes, and said first exhaust pipe communicates with said exhaust chamber.

13. A substrate processing apparatus as recited in claim 12, wherein said first exhaust pipe communicates with said exhaust chamber substantially at the center of said substrate placing portion as viewed from above said substrate placing portion.

14. A substrate processing apparatus as recited in claim 13, wherein said first exhaust pipe communicates with said exhaust chamber, at a portion within a circle having a radius of L/4 and centered at the center of said substrate placing portion as viewed from above said substrate placing portion, where L is a distance between a pair of second exhaust holes which are most distant from each other among second exhaust holes.

15. A substrate processing apparatus comprising:
an outer chamber having an exhaust hole;
an inner chamber disposed in said outer chamber;
a reactive gas inlet pipe communicating with said inner chamber;
a first exhaust pipe disposed to be capable of communicating with said inner chamber, said first exhaust pipe extending at least to an inner wall surface of said outer chamber;
a second exhaust pipe communicating with the exhaust hole; and
a substrate placing portion disposed in said inner chamber,
wherein said inner chamber has a plurality of second exhaust holes surrounding said substrate placing portion, the plurality of second exhaust holes being capable of communicating with said first exhaust pipe.

16. A substrate processing apparatus as recited in claim 15, further comprising an exhaust chamber disposed in said outer chamber, wherein said exhaust chamber is disposed under said inner chamber, said inner chamber communicates with said exhaust chamber through the second exhaust holes, and said first exhaust pipe communicates with said exhaust chamber.

17. A substrate processing apparatus as recited in claim 16, wherein said first exhaust pipe communicates with said exhaust chamber substantially at the center of said substrate placing portion as viewed from above said substrate placing portion.

18. A substrate processing apparatus as recited in claim 16, wherein said first exhaust pipe communicates with said exhaust chamber, at a portion within a circle having a radius of L/4 and centered at the center of said substrate placing portion as viewed from above said substrate placing portion, where L is a distance between a pair of second exhaust holes which are most distant from each other among said second exhaust holes.

19. A substrate processing apparatus as recited in claim 15, wherein said substrate processing apparatus is a plasma CVD apparatus.

20. A substrate processing apparatus comprising:
an outer chamber having an exhaust hole;
an inner chamber disposed in said outer chamber;
a reactive gas inlet pipe communicating with said inner chamber;
a first exhaust pipe disposed to be capable of communicating with said inner chamber, said first exhaust pipe extending at least to an inner wall surface of said outer chamber;
a second exhaust pipe communicating with the exhaust hole;
one or more third exhaust pipes disposed to be capable of communicating with said inner chamber, said one or more third exhaust pipes extending at least to the inner wall surface of said outer chamber;
a substrate placing portion disposed in said inner chamber, said inner chamber having a plurality of second exhaust holes surrounding said substrate placing portion; and
an exhaust chamber disposed in said outer chamber, said exhaust chamber being disposed under said inner chamber, said inner chamber communicating with said exhaust chamber through the second exhaust holes, and said first exhaust pipe and said one or more third exhaust pipes communicating with said exhaust chamber.

21. A substrate processing apparatus as recited in claim 20, wherein said substrate placing portion has a substantially rectangular shape as viewed from above, and said first exhaust pipe and said one or more third exhaust pipes communicate with said exhaust chamber at positions located, as viewed from above said substrate placing portion, on one of or both of two diagonals of the rectangular substrate placing portion symmetrically with respect to the center of the rectangular substrate placing portion.

22. A substrate processing apparatus as recited in claim 20, wherein said substrate processing apparatus is a plasma CVD apparatus.

23. A plasma processing apparatus comprising:
an outer chamber having an exhaust hole;
an inner chamber disposed in said outer chamber;
a reactive gas inlet pipe communicating with said inner chamber;
a first exhaust pipe disposed to be capable of communicating with said inner chamber, said first exhaust pipe extending at least to an inner wall surface of said outer chamber; and
a second exhaust pipe communicating with the exhaust hole,
wherein
said outer chamber has a lower outer chamber and an upper outer chamber,
one of a cathode and an anode is mounted in said upper outer chamber,
an inner chamber upper wall is mounted on said upper outer chamber such that the inner chamber upper wall surrounds said one of the cathode and the anode,
the other of the cathode and the anode is disposed in said outer chamber in a vertically movable manner,
said the other of the cathode and the anode has a substrate placing portion,
an inner chamber lower wall corresponding to the inner chamber upper wall is provided around said the other of the cathode and the anode,
a plurality of second exhaust holes are formed in the inner chamber lower wall such that the second exhaust holes surround the substrate placing portion, the second exhaust holes being capable of communicating with said first exhaust pipe, the cathode, the anode, the inner chamber upper wall and the inner chamber lower wall form said inner chamber when said the other of the cathode and the anode rises, and when said the other of the cathode and the anode rises to form said inner chamber, said first exhaust pipe extends at least to the inner wall surface of said outer chamber.

24. A plasma processing apparatus as recited in claim 23, wherein when said the other of the cathode and the anode rises to form said inner chamber, the forward end of said first exhaust pipe is inserted into the exhaust hole such that the forward end of said first exhaust pipe projects outward beyond the inner wall surface of said outer chamber, and a spacing is formed between said first exhaust pipe and the exhaust hole.

25. A plasma processing apparatus as recited in claim 23, further comprising an exhaust chamber disposed in said outer chamber, wherein said exhaust chamber is disposed under said the other of the cathode and the anode, said inner chamber communicates with said exhaust chamber through the second exhaust holes, and said first exhaust pipe communicates with said exhaust chamber.

26. A substrate processing apparatus as recited in claim 23, wherein said substrate processing apparatus is a plasma CVD apparatus.

27. A substrate processing apparatus comprising:

an outer chamber having a first exhaust hole;

only one inner chamber disposed in said outer chamber;

a reactive gas inlet pipe communicating with said inner chamber; and only one substrate placing portion disposed in said inner chamber, wherein said inner chamber has a plurality of second exhaust holes surrounding said substrate placing portion and communicates with said outer chamber through the second exhaust holes, the first exhaust hole is located substantially at the center of said substrate placing portion as viewed from above said substrate placing portion and the first exhaust hole is located substantially at the center of said outer chamber as viewed from above said substrate placing portion.

28. A substrate processing apparatus comprising:

an outer chamber having a first exhaust hole;

an inner chamber disposed in said outer chamber;

a reactive gas inlet pipe communicating with said inner chamber;

a substrate placing portion disposed in said inner chamber, said inner chamber having a plurality of second exhaust holes surrounding said substrate placing portion; and an exhaust chamber disposed in said outer chamber, said exhaust chamber being disposed under said inner chamber, wherein said inner chamber communicates with said exhaust chamber through the second exhaust holes, and said exhaust chamber has a third exhaust hole, which is located substantially at the center of said substrate placing portion as viewed from above said substrate placing portion.

* * * * *